United States Patent
Jun et al.

(10) Patent No.: US 8,389,981 B2
(45) Date of Patent: Mar. 5, 2013

(54) ORGANIC LIGHT EMITTING DIODE LIGHTING EQUIPMENT

(75) Inventors: Hyuk-Sang Jun, Yongin (KR); Ok-Keun Song, Yongin (KR); Young-Mo Koo, Yongin (KR); Jung-Ha Lee, Yongin (KR); Il-Hwa Hong, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 156 days.

(21) Appl. No.: 12/868,650

(22) Filed: Aug. 25, 2010

(65) Prior Publication Data

US 2011/0049493 A1    Mar. 3, 2011

(30) Foreign Application Priority Data

Aug. 25, 2009  (KR) .................. 10-2009-0078947

(51) Int. Cl.
    *H01L 51/52*    (2006.01)
(52) U.S. Cl. ........................................... 257/40
(58) Field of Classification Search .............. 257/40, 257/98, 99
    See application file for complete search history.

(56) References Cited

U.S. PATENT DOCUMENTS

| 2003/0030717 A1 | 2/2003 | Murao |
| 2005/0116620 A1* | 6/2005 | Kobayashi ............ 313/503 |
| 2006/0119260 A1* | 6/2006 | Kim ..................... 313/506 |
| 2010/0012943 A1 | 1/2010 | Park et al. |
| 2010/0013379 A1 | 1/2010 | Park |
| 2010/0308365 A1* | 12/2010 | Masuya et al. ............. 257/98 |

FOREIGN PATENT DOCUMENTS

| KR | 10-2007-0017841 | 2/2007 |
| KR | 10-2008-0048269 | 6/2008 |
| KR | 10-2009-0004263 | 1/2009 |
| KR | 10-2009-0060175 | 6/2009 |

* cited by examiner

*Primary Examiner* — Marcos D. Pizarro
*Assistant Examiner* — Sue Tang
(74) *Attorney, Agent, or Firm* — Robert E. Bushnell, Esq.

(57) ABSTRACT

An organic light emitting diode lighting equipment includes a transparent substrate main body, a first electrode formed on the substrate main body, a subsidiary electrode formed on the first electrode to partition the first electrode at a predetermined distance, an organic emissive layer formed on the first electrode, and a second electrode formed on the organic emissive layer. The subsidiary electrode has an inclined lateral side facing toward the organic emissive layer.

13 Claims, 5 Drawing Sheets

ORGANIC LIGHT EMITTING DIODE LIGHTING EQUIPMENT

CLAIM OF PRIORITY

This application makes reference to, incorporates the same herein, and claims all benefits accruing under 35 U.S.C. §119 from an application earlier filed in the Korean Intellectual Property Office on 25 Aug. 2009 and there duly assigned Serial No. 10-2009-0078947.

BACKGROUND OF THE INVENTION

1. Field of the Invention

The described technology relates generally to a lighting equipment, and more particularly, to an organic light emitting diode lighting equipment which uses an organic light emitting diode.

2. Description of the Related Art

An organic light emitting diode (OLED) generally has a hole injection electrode, an organic emissive layer, and an electron injection electrode. The organic light emitting diode emits light by way of energy generated when excitons existing in a formation of combinations of electrons and holes within an organic emissive layer fall from an excited state to a ground state.

SUMMARY OF THE INVENTION

It is therefore an aspect of the present invention to provide an improved organic light emitting diode lighting equipment having advantages of enhancing optical efficiency by wholly utilizing the light emitted from the organic emissive layer.

An exemplary embodiment of the present invention provides an organic light emitting diode lighting equipment including a transparent substrate main body, a first electrode formed on the substrate main body, a subsidiary electrode formed on the first electrode to partition the first electrode at a predetermined distance, an organic emissive layer formed on the first electrode, and a second electrode formed on the organic emissive layer. The subsidiary electrode has an inclined lateral side facing toward the organic emissive layer.

The subsidiary electrode may be formed with a reflective material.

The first electrode may be formed with a transparent material, and the second electrode may be formed with a reflective material.

The subsidiary electrode may be electrically connected to the first electrode, and formed with a material having lower resistivity than the first electrode.

The subsidiary electrode may have at least one of a mesh shape and a stripe shape.

The subsidiary electrode may be shaped with various geometrical figures including a star, a triangle, and a hexagon.

The subsidiary electrode may be shaped with at least one of numbers, symbols, and letters.

The first electrode, the organic emissive layer, and the second electrode may be sequentially deposited within the area defined by the subsidiary electrode.

An insulating layer may cover the subsidiary electrode to insulate the subsidiary electrode from the second electrode.

The subsidiary electrode may have a bottom side facing toward the first electrode and a top side facing toward the second electrode such that the bottom side is larger in width than the top side.

The light emitted from the organic emissive layer may be partially firstly reflected against the lateral side of the subsidiary electrode and secondly reflected against the second electrode, while the reflected light passes through the first electrode and is discharged to the outside of the organic light emitting diode lighting equipment.

The subsidiary electrode may have a bottom side facing toward the first electrode and a top side facing toward the second electrode such that the bottom side is smaller in width than the top side of the organic light emitting diode lighting equipment.

The light emitted from the organic emissive may be partially reflected against the lateral side of the subsidiary electrode, and passes through the first electrode and is then discharged to the outside of the organic light emitting diode lighting equipment.

With organic light emitting diode lighting equipment constructed as an exemplary embodiment of the present invention, the optical efficiency is enhanced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
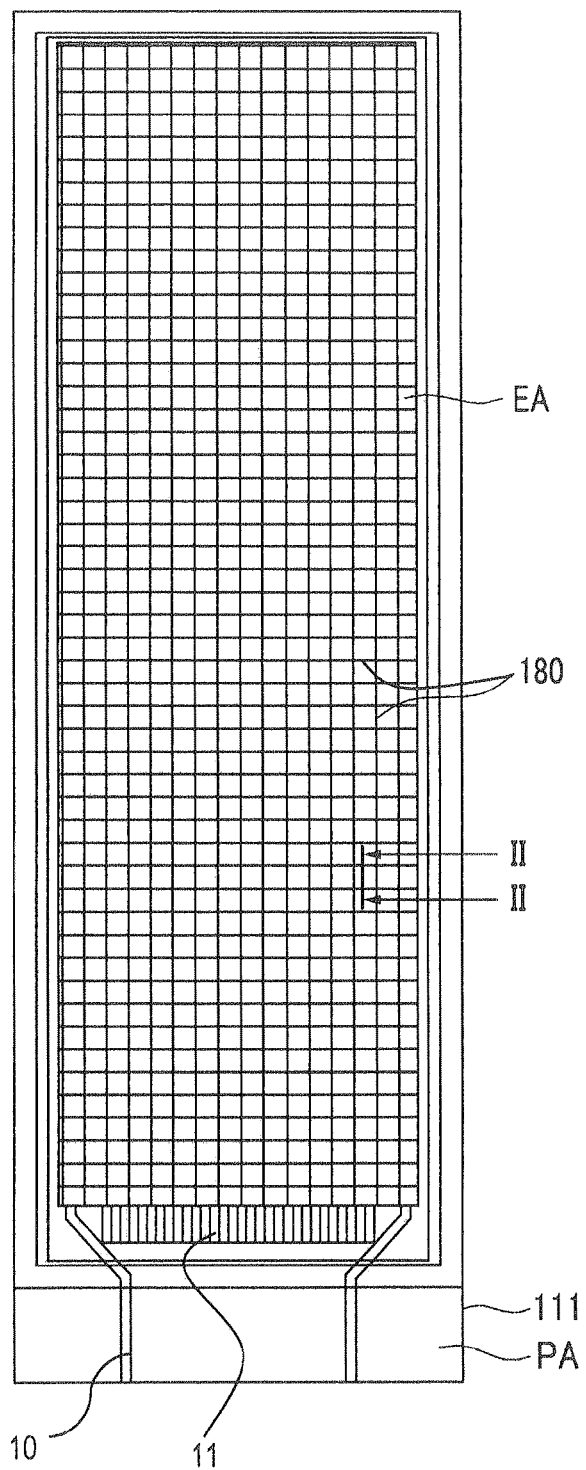
FIG. 1 is a layout and plan view of organic light emitting diode lighting equipment constructed as a first exemplary embodiment of the present invention.

An organic light emitting diode (OLED) generally has a hole injection electrode, an organic emissive layer, and an electron injection electrode. The organic light emitting diode emits light by way of energy generated when excitons existing in a formation of combinations of electrons and holes within an organic emissive layer fall from an excited state to a ground state.

An organic light emitting diode lighting equipment is based on an organic light emitting diode, and functions as a surface light source. The organic light emitting diode lighting equipment may be used for various purposes because of the merits of the surface light source, and the usage thereof is gradually increasing.

Meanwhile, even though the organic light emitting diode lighting equipment functions as a surface light source, the organic emissive layer directly generating light from the inside emits light in a radial manner. Generally, the light emitted in a direction crossing both of the hole injection electrode and the electron injection electrode may be effectively and be wholly discharged to the exterior of the organic light emitting diode lighting equipment. It is problematic that the light emitted in a direction parallel to both of the hole injection electrode and the electron injection electrode is not efficiently discharged to the exterior of the organic light emitting diode lighting equipment but vanishes during the transition between layers.

The above information disclosed is only for enhancement of understanding of the background of the described technology and therefore it may contain information that does not form the prior art that is already known in this country to a person of ordinary skill in the art.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Furthermore, with exemplary embodiments, detailed description is given for the constituent elements in the first exemplary embodiment with reference to the relevant drawings by using the same reference numerals for the same constituent elements, while only different constituent elements from those related to the first exemplary embodiment are described in other exemplary embodiments.

Parts that are irrelevant to the description are omitted in order to clearly describe the present invention, and like reference numerals designate like elements throughout the specification.

Furthermore, as the size and thickness of the respective structural components shown in the drawings are arbitrarily illustrated for explanatory convenience, the present invention is not necessarily limited to as illustrated.

In the drawings, the thickness of layers, films, panels, regions, etc., are exaggerated for clarity and explanatory convenience. It will be understood that when an element such as a layer, film, region, or substrate is referred to as being "on" another element, it can be directly on the other element or intervening elements may also be present. Also, when an element is referred to as being "connected to" another element, it can be directly connected to another element or be indirectly connected to another element with one or more intervening elements interposed therebetween.

An organic light emitting diode lighting equipment constructed as a first exemplary embodiment will be described with reference to FIG. 1 and FIG. 2.

Figure 2:
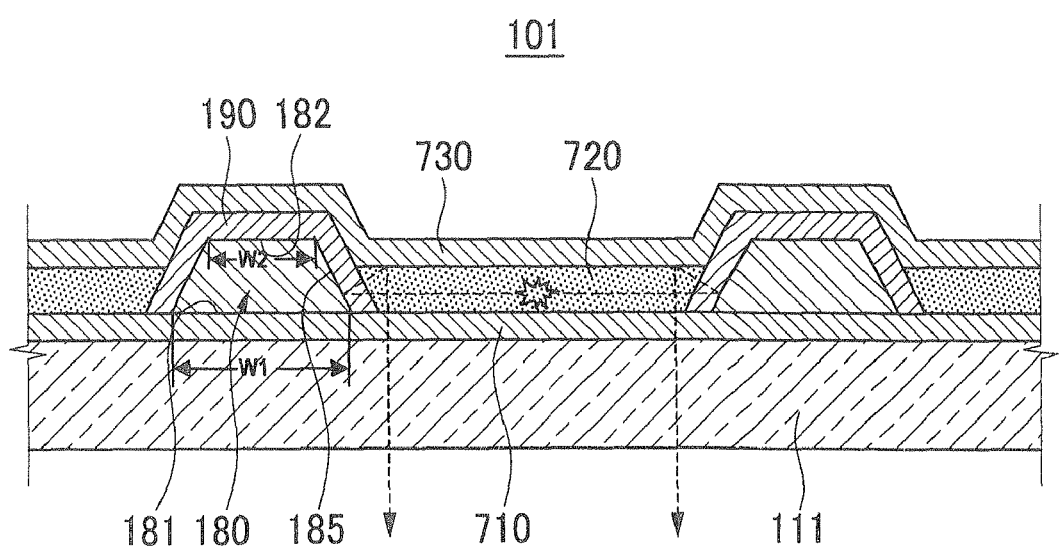
FIG. 2 is a cross-sectional view of the organic light emitting diode lighting equipment taken along the line II-II of FIG. 1.

As shown in FIG. 1 and FIG. 2, organic light emitting diode lighting equipment 101 constructed as a first exemplary embodiment includes a substrate main body 111, a first electrode 710, a subsidiary electrode 180, an insulating layer 190, an organic emissive layer 720, and a second electrode 730. Here, the first electrode 710, organic emissive layer 720, and the second electrode 730 collectively form an organic light emitting diode (OLED).

Substrate main body 111 is formed with a transparent insulating material. Specifically, substrate main body 111 is formed with an insulating material such as glass, quartz, ceramic, and plastic. Furthermore, substrate main body 111 is demarcated into a light emitting area EA and a pad area PA. Pads 11 extend from light emitting area EA to pad area PA in order to electrically connect the internal electrodes 710, 730 and 180 to the external power supply (not shown). Insulator area 10 may separate anodes disposed in the middle from cathodes disposed on both sides.

The first electrode 710 is formed on substrate main body 111 with a transparent conductive material. The transparent conductive material for the first electrode 710 may be selected from indium tin oxide (ITO), indium zinc oxide (IZO), zinc oxide (ZnO), and indium oxide ($In_2O_3$).

Furthermore, the first electrode 710 may function as a positive (+) electrode or an anode and function as the hole injection electrode. The second electrode 730 may function as a negative (−) electrode or a cathode and function as the electron injection electrode.

Subsidiary electrode 180 is formed on the first electrode 710 so as to partition the first electrode 710 by a predetermined distance. As shown in FIG. 1, with the first exemplary embodiment, subsidiary electrode 180 is formed in the shape of a mesh. The first exemplary embodiment is however not limited thereto. Therefore, subsidiary electrode 180 may be formed in the shape of a stripe or a figure selected from various geometrical figures such as a star (FIG. 3), a triangle, and a hexagon. Furthermore, subsidiary electrode 180 may be formed with one or more of numbers, symbols, and letters (FIG. 4). In this way, depending upon the shape of subsidiary electrode 180, organic light emitting diode lighting equipment 101 may display simple pictures or devices, letters, and numbers during the emissive or non-emissive period.

Figure 3:
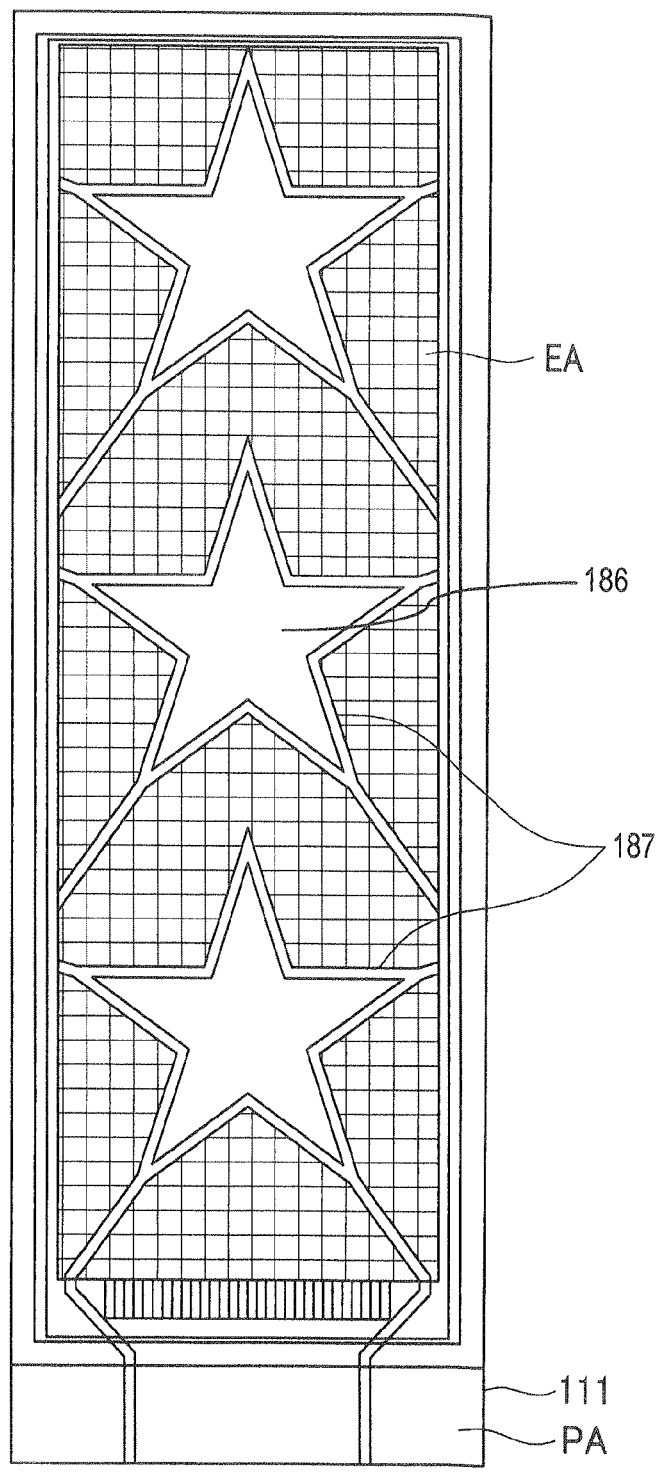
FIG. 3 and FIG. 4 are layout and plan views of variants of the organic light emitting diode lighting equipment constructed as the first exemplary embodiment of the present invention.
Figure 4:
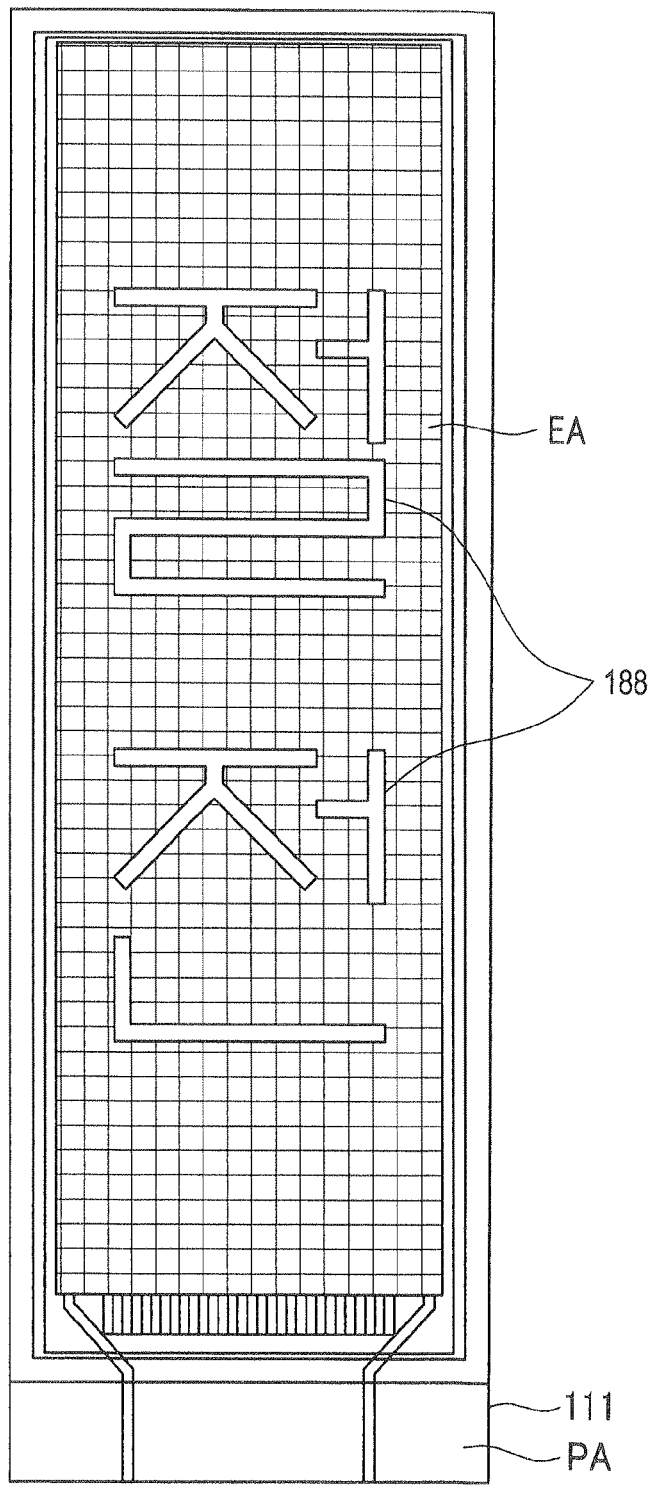

FIG. 3 and FIG. 4 illustrate variants of the organic light emitting diode lighting equipment in accordance with the first exemplary embodiment where subsidiary electrodes 187 and 188 are varied in shape.

Specifically, FIG. 3 illustrates the case where subsidiary electrode 187 is formed in the shape of a geometrical figure, for example, a star. In FIG. 3, the dual periphery of the star may be formed of subsidiary electrode 187, and a free area 186 without subsidiary electrode 187 is disposed within the inner periphery. Subsidiary electrode 187 may further include a mesh structure surrounding the geometrical figure, i.e., the star.

FIG. 4 illustrates the case where the subsidiary electrode 188 may be formed in the shape of letters. Subsidiary electrode 188 may further include a mesh structure surrounding the shape of letters.

Turning now to FIG. 2. Subsidiary electrode 180 is electrically connected to the first electrode 710 and formed with a material having lower electrical resistivity than the first electrode 710. Subsidiary electrode 180 may be formed with a reflective material. Specifically, subsidiary electrode 180 may be formed with a material such as lithium (Li), calcium (Ca), lithium fluoride/calcium (LiF/Ca), lithium fluoride/aluminum (LiF/Al), aluminum (Al), silver (Ag), magnesium (Mg), and gold (Au). However, the first exemplary embodiment is not limited thereto, and any materials may be used to form subsidiary electrode 180 provided that such materials reflect light and have higher electrical conductivity than the first electrode 710. That is, non-metallic materials may be used to form subsidiary electrode 180 as long as the non-metallic materials effectively reflect light and have higher electrical conductivity than the first electrode 710. LiF/Ca may refer to a mixture of lithium fluoride and calcium. LiF/Al may refer to a mixture of lithium fluoride and aluminum Subsidiary electrode 180 formed on the first electrode 710 in the shape of a mesh serves to make the current flowing along the first electrode 710 be wholly uniform even if the area of the first electrode 710 is widened. That is, subsidiary electrode 180 compensates for the relatively low electrical conductivity of the first electrode 710, and prevents the luminance of the light emitted from organic emissive layer 720 of organic light emitting diode lighting equipment 101 from being wholly non-uniform. The transparent conductive materials forming the first electrode 710 may be metals having a higher electrical resistivity compared to the material forming subsidiary electrode 180. Accordingly, the wider the area of the first electrode 710 is, the more difficult it becomes to make the current flowing along the first electrode 710 wholly uniform. That is, with the light emitted from organic emissive layer 720 disposed between the first and second electrodes 710 and 730 without subsidiary electrode 180, the wider the area of the first electrode 710 is, the more non-uniform the whole luminance becomes.

Insulating layer 190 covers subsidiary electrode 180 in order to electrically insulate subsidiary electrode 180 from the second electrode 730. With the first exemplary embodiment, insulating layer 190 may be formed with an inorganic material such as silicon oxide and silicon nitride. However, the first exemplary embodiment is not limited thereto. Therefore, various kinds of inorganic or organic materials that are well known to a person of ordinary skill in the art may be used to form insulating layer 190.

Meanwhile, insulating layer 190 may be omitted provided that subsidiary electrode 180 and the second electrode 730 are securely electrically insulated from each other under the absence of insulating layer 190. For example, organic emissive layer 720 may also be disposed between subsidiary electrode 180 and the second electrode 730 so that organic emissive layer 720 may play a role of insulating layer 190. In this case, it is not required to form a separate insulating layer 190 on subsidiary electrode 180.

Organic emissive layer 720 is formed on the first electrode 710 within the area defined by subsidiary electrode 180. That is, organic emissive layer 720 is placed at the lateral side 185 of subsidiary electrode 180. Accordingly, the first electrode 710, organic emissive layer 720, and the second electrode 730 are sequentially deposited within the area defined by subsidiary electrode 180.

Furthermore, organic emissive layer 720 is formed with a low molecular organic material or a high molecular organic material. Organic emissive layer 720 may have a multiple layered structure with more than one of an emissive layer, a hole injection layer (HIL), a hole transporting layer (HTL), an electron transporting layer (ETL), and an electron injection layer (EIL). If organic emissive layer 720 has all of the above layers, the hole injection layer (HIL) is disposed on the first electrode 710 being the anode, and is sequentially overlaid with the hole transporting layer (HTL), the emissive layer, the electron transporting layer (ETL), and the electron injection layer (EIL).

Furthermore, it is illustrated in FIG. 2 that organic emissive layer 720 is disposed only within the area defined by subsidiary electrode 180, but the first exemplary embodiment is not limited thereto. Therefore, organic emissive layer 720 may be formed on subsidiary electrode 180 as well as on the first electrode 710. That is, both the lateral and top sides 185 and 182 of the subsidiary electrode 180 may face toward the organic emissive layer 720. In this case, insulating layer 190 may be omitted because subsidiary electrode 180 is electrically insulated from second electrode 730 by organic emissive layer 720.

The second electrode 730 may be formed on organic emissive layer 720 formed on the first electrode 710, and on insulating layer 190 covering subsidiary electrode 180.

Furthermore, the lateral side 185 of subsidiary electrode 180 facing toward organic emission layer 720 is formed in an inclined manner. With the first exemplary embodiment, subsidiary electrode 180 is formed in the shape of a taper. Specifically, subsidiary electrode 180 is formed such that width W1 of the bottom side 181 thereof facing toward the first electrode 710 is larger than width W2 of the top side 182 thereof facing toward the second electrode 730.

Furthermore, organic emissive layer 720 is formed only within the emissive area EA of substrate main body 111, and one or more of the first electrode 710 and subsidiary electrode 180, and the second electrode 730, are elongated from the emissive area EA of substrate main body 111 to the pad area PA thereof. The electrodes 180, 710, and 730 elongated to the pad area PA of the substrate main body 111 are connected to an external power supply (not shown) at the pad area PA.

Furthermore, even though not shown in FIG. 2, organic light emitting diode lighting equipment 101 may include a sealing member disposed on the second electrode 730 to protect organic emissive layer 720. In this case, the space between the sealing member and substrate main body 111 is sealed.

The sealing member may be formed with an insulating substrate based on glass, quartz, ceramic, or plastic, or a metallic plate based on stainless steel.

Furthermore, the sealing member may have a structure with one or more organic or inorganic layers, or may be a composite structure with one or more inorganic layers and one or more organic layers.

As shown in FIG. 2, with organic light emitting diode lighting equipment 101 constructed as the first exemplary embodiment, light is emitted from organic emissive layer 720 where the holes and the electrons supplied from the first and second electrodes 710 and 730 respectively combine with each other. The light emitted from organic emissive layer 720 is discharged in a radial manner. With the light emitted from organic emission layer 720, the optical components progressed toward the first electrode 710 directly pass through the transparent first electrode 710, and are directly discharged to the outside of organic light emitting diode lighting equipment 101. The optical components progressed toward the second electrode 730 are reflected against the second electrode 730, and pass through the first electrode 710 and are then discharged to the outside of organic light emitting diode lighting equipment 101. The light progressed toward subsidiary electrode 180 is firstly reflected against the lateral side of subsidiary electrode 180, and is secondly reflected against the second electrode 730. Then, the light passes through the first electrode 710 and is discharged to the outside. The arrows indicated by dotted lines in FIG. 2 represent the trajectory of light.

In this way, with the organic light emitting diode lighting equipment constructed as the first exemplary embodiment, the light emitted from the organic emissive layer is wholly utilized, thereby enhancing the optical efficiency.

Organic light emitting diode lighting equipment constructed as a second exemplary embodiment will now be described with reference to FIG. 5.

Figure 5:
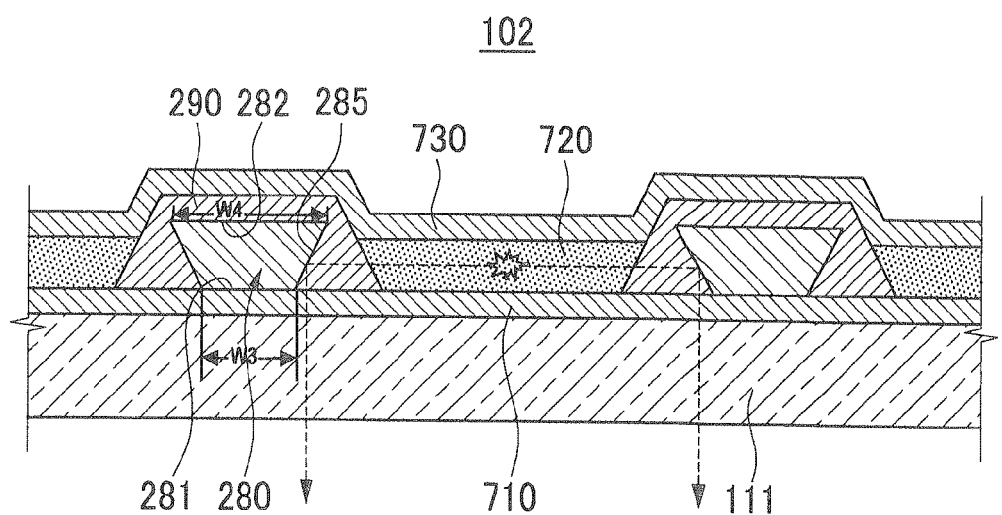
FIG. 5 is a partial sectional view of organic light emitting diode lighting equipment constructed as a second exemplary embodiment of the present invention.

As shown in FIG. 5, with organic light emitting diode lighting equipment 102 constructed as a second exemplary embodiment, it is structured such that width W3 of the bottom side 281 of subsidiary electrode 280 facing toward the first electrode 710 is smaller than width W4 of the top side 282 thereof facing toward the second electrode 730.

Accordingly, with the light emitted from organic emissive layer 720, the optical components progressed toward subsidiary electrode 280 are reflected against the lateral side 285 of subsidiary electrode 280, and pass through the transparent first electrode 710 and are then discharged to the outside. The arrows indicated by dotted lines in FIG. 5 represent the trajectory of light.

The reference numeral 290 of FIG. 3 represents an insulating layer. With the second exemplary embodiment, considering the shape of subsidiary electrode 280, it is effective that insulating layer 290 is formed with an organic layer having higher fluidity compared to the inorganic layer.

In this way, with organic light emitting diode lighting equipment 102 constructed as the second exemplary embodiment, the light emitted from organic emissive layer 720 is wholly utilized in a more effective manner, thereby enhancing the optical efficiency.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode lighting equipment, comprising:
    a transparent substrate main body;
    a first electrode formed on the substrate main body;
    a subsidiary electrode formed on the first electrode to partition the first electrode at a predetermined distance;
    an organic emissive layer formed on the first electrode; and
    a second electrode formed on the organic emissive layer, with
    the subsidiary electrode having an inclined lateral side facing toward the organic emissive layer,
    light emitted from the organic emissive layer being partially firstly reflected against the lateral side of the subsidiary electrode and secondly reflected against the second electrode, while the reflected light passes through the first electrode and is discharged to an exterior of the organic light emitting diode lighting equipment.

2. The organic light emitting diode lighting equipment of claim 1, wherein the subsidiary electrode is formed from a reflective material.

3. The organic light emitting diode lighting equipment of claim 2, wherein the first electrode is formed from a transparent material, and the second electrode is formed from a reflective material.

4. The organic light emitting diode lighting equipment of claim 3, wherein the subsidiary electrode is electrically connected to the first electrode, and is formed from a material having a lower electrical resistivity compared to the first electrode.

5. The organic light emitting diode lighting equipment of claim 3, wherein the subsidiary electrode has a shape selected from the group consisting of a mesh shape and a stripe shape.

6. The organic light emitting diode lighting equipment of claim 3, wherein the subsidiary electrode has a shape selected from a group consisting of various geometrical figures including a star, a triangle, and a hexagon.

7. The organic light emitting diode lighting equipment of claim 3, wherein the subsidiary electrode has a shape selected from a group consisting of numbers, symbols, and letters.

8. The organic light emitting diode lighting equipment of claim 1, wherein the first electrode, the organic emissive layer, and the second electrode are sequentially deposited within the area defined by the subsidiary electrode.

9. The organic light emitting diode lighting equipment of claim 1, further comprising an insulating layer covering the subsidiary electrode to electrically insulate the subsidiary electrode from the second electrode.

10. The organic light emitting diode lighting equipment of claim 1, wherein the subsidiary electrode has a bottom side facing toward the first electrode and a top side facing toward the second electrode such that the bottom side is larger in width than the top side.

11. An organic light emitting diode lighting equipment, comprising:
    a transparent substrate;
    a transparent first electrode formed on the transparent substrate;
    an organic emissive layer formed on the transparent first electrode;
    a reflective subsidiary electrode protruding from the transparent first electrode and formed in a predetermined pattern, and the reflective subsidiary electrode comprising a protrusion having inclined lateral sides which face toward the organic emissive layer; and
    a reflective second electrode formed on the organic emissive layer and electrically insulated from both of the transparent first electrode and the reflective subsidiary electrode,
    light emitted from the organic emissive layer being partially firstly reflected against the lateral sides of the reflective subsidiary electrode and secondly reflected against the reflective second electrode, while the reflected light passes through the transparent first electrode and is wholly discharged to an exterior of the organic light emitting diode lighting equipment.

12. The organic light emitting diode lighting equipment of claim 11, wherein the reflective subsidiary electrode has a bottom side facing toward the transparent first electrode and a top side facing toward the reflective second electrode such that the bottom side is different in width compared to the top side.

13. The organic light emitting diode lighting equipment of claim 12, wherein the reflective subsidiary electrode has a bottom side facing toward the transparent first electrode and a top side facing toward the reflective second electrode such that the bottom side is larger in width compared to the top side.

* * * * *